(12) United States Patent
Zimmer et al.

(10) Patent No.: US 8,143,076 B2
(45) Date of Patent: Mar. 27, 2012

(54) MANUFACTURE OF DEFECT CARDS FOR SEMICONDUCTOR DIES

(75) Inventors: Hans-Guenter Zimmer, Reute (DE); Joerg Krause, Freiburg (DE)

(73) Assignee: Micronas GmbH, Freiburg I. BR. (DE)

( * ) Notice: Subject to any disclaimer, the term of this patent is extended or adjusted under 35 U.S.C. 154(b) by 19 days.

(21) Appl. No.: 12/771,626

(22) Filed: Apr. 30, 2010

(65) Prior Publication Data
US 2010/0297785 A1   Nov. 25, 2010

(30) Foreign Application Priority Data
Apr. 30, 2009  (EP) .................................... 09006004

(51) Int. Cl.
H01L 21/66  (2006.01)
G01R 31/20  (2006.01)
(52) U.S. Cl. ...................... 438/14; 438/17; 324/754.01
(58) Field of Classification Search .................. 438/10, 438/14, 17; 324/754.01
See application file for complete search history.

(56) References Cited

U.S. PATENT DOCUMENTS

| | | | | |
|---|---|---|---|---|
| 5,818,249 A * | 10/1998 | Momohara | ............... | 324/756.03 |
| 6,262,586 B1 * | 7/2001 | Furasawa | ................ | 324/750.24 |
| 6,974,710 B2 * | 12/2005 | Taira | ............................. | 438/17 |
| 7,375,508 B2 * | 5/2008 | Bucksch | ................. | 324/750.02 |
| 2003/0107035 A1 * | 6/2003 | Maga | ............................. | 257/48 |
| 2006/0043998 A1 | 3/2006 | Suciu et al. | | |
| 2006/0103408 A1 * | 5/2006 | Takahashi et al. | ............ | 324/765 |
| 2009/0000995 A1 | 1/2009 | Yanai | | |
| 2010/0013509 A1 * | 1/2010 | Setoguchi et al. | ............ | 324/760 |
| 2010/0213963 A1 * | 8/2010 | Yoshikawa | ................... | 324/761 |
| 2010/0244877 A1 * | 9/2010 | Ko | ................ | 324/758 |

FOREIGN PATENT DOCUMENTS
JP   2004047542   2/2004

OTHER PUBLICATIONS

Chenn-Jung et al. "Image Processing Techniques for Wafer Defect Cluster Identification", IEE Design & Test of Computers, vol. 19, No. 2, Mar. 1, 2002, pp. 44-48.

* cited by examiner

*Primary Examiner* — Alexander Ghyka
(74) *Attorney, Agent, or Firm* — Muncy, Geissler, Olds & Lowe, PLLC

(57) ABSTRACT

A method for producing a defect card for individual dies located on a wafer, comprising: producing first and second defect cards, where the defective individual dies whose adjoining individual dies form an environment having a defect density up to a first value ($\delta_1$) are classified as defective on the first defect card, and where the defective individual dies which are not considered upon the production of the first defect card are classified as defective on the second defect card; producing a third defect card by classifying additional individual dies on the second defect card as defective, where adjoining individual dies of the additional defective individual dies form an environment having at least one defect density of a second value ($\delta_2$), which second value is less than the first value ($\delta_1$); and producing a fourth defect card by unifying the third defect card with the first defect card.

9 Claims, 5 Drawing Sheets

Defective  Good  Inked

MANUFACTURE OF DEFECT CARDS FOR SEMICONDUCTOR DIES

PRIORITY INFORMATION

This patent application claims priority from European Patent Application No. 09006004.7 filed Apr. 30, 2009, which is hereby incorporated by reference.

BACKGROUND OF THE INVENTION

This disclosure relates to the manufacture and testing of semiconductor wafers, and in particular to a defect card for individual semiconductor dies.

Generally, as industrial products become more complex, their quality must also increase. This is particularly true for semiconductors, where functional or parameter tests are typically performed at various stages during their manufacture.

Semiconductive dies are typically manufactured on wafers (e.g., silicon). Each wafer is cut into a plurality of dies. The size of the individual die and the number of die per wafer are determined by design and the technology.

The dies are tested for their functional capability during a post semiconductor manufacturing procedure referred to as probing. Probing is typically performed before the semiconductor wafer is cut into discrete die, in a measuring apparatus referred to as a prober. In the prober, defective dies are marked with ink, or x-y location data indicative of their position on the wafer is stored in memory. A ratio of the functioning dies (i.e., the unmarked dies) to the total number of the manufactured dies is a factor in determining the cost-effectiveness of the semiconductor manufacturing process.

Due in part to complex die manufacturing methods, systematic flaws typically occur in limited areas of the wafer, while random or stochastic flaws can be distributed over the entire semiconductor wafer. Statistical methods may be applied to detect substantially all the defective dies on the wafer, which includes those defective dies having a latent flaw that can increase the probability of a later breakdown of the die.

In a typical semiconductor wafer, dies are arranged in rows and columns, such that, except proximate edges of the wafer, each die is surrounded by eight adjacent dies. Therefore, if defective dies are clustered in one area of the wafer, there is a higher probability that dies adjacent to those defective dies are also flawed since clustered flaws indicate a systematic flaw. This premise is implemented in a method known as the x/8 rule, where x dies surrounding a defective die are recognized as flawed, and the remaining (8−x) dies are marked as flawed, for example, by inking For example, the ⅜ rule states that in the event three defective dies surround one defective die, the remaining 5 dies that surround this defective die should also marked as defective. This procedure may be repeated multiple times, where the dies inked later are assumed to be defective in this iteration.

One disadvantage of such a method is that edges of contiguous regions are not recognized. Another disadvantage is that sufficiently high defect densities that are statistically distributed over the wafer result in the marking of all dies located in this entire region as defective. Examples of this are shown in FIGS. 2 and 4, where dies recognized as defective are marked as "defective", and dies surrounding the defective dies are marked as "inked". Specifically, FIG. 2 illustrates a wafer having a uniformly distributed defect density of 3.0/cm². Notably, nearly the entire region of the wafer is inked using the described ⅜ rule. FIG. 4 illustrates a circled region "I", in which the edges of contiguous regions are not recognized during the probing and, therefore, are inked as defective.

There is a need for an improved method of creating a defect card, which avoids the above-mentioned disadvantages, and a prober for performing this method.

SUMMARY OF THE INVENTION

According to an aspect of the present invention, a method is provided for producing a defect card for individual dies located on a wafer, in which defective individual dies are first identified using a measuring procedure. The method includes producing first and second defect cards such that the defective individual dies are disjunctively associated with the first and the second defect cards, where the defective individual dies whose adjoining individual dies form an environment having a defect density up to a first value ($\delta_1$) are classified as defective on the first defect card, and where the defective individual dies which are not considered upon the production of the first defect card are classified as defective on the second defect card; producing a third defect card by classifying additional individual dies on the second defect card as defective, where adjoining individual dies of the additional defective individual dies form an environment having at least one defect density of a second value ($\delta_2$), which second value is less than the first value ($\delta_1$); and producing a fourth defect card by unifying the third defect card with the first defect card.

First and second defect card are produced such that the defective individual dies are disjunctively associated with the first and the second defect cards, where only the defective individual dies whose adjoining individual dies form an environment having a defect density up to a first value $\delta_1$ are classified as defective on the first defective card, and where the defective individual dies that are not considered upon the production of the first defect card are classified as defective on the second defect card. The first value $\delta_1$ may be selected such that individual dies having randomly distributed flaws (i.e., having lower flaw density) are detected therewith. The first value $\delta_1$ as the defect density is preferably ⅜ (according to the x/8 rule described above).

A third defect card may be created from the second defect card such that additional individual dies are classified as defective on the second defect card, whose adjoining individual dies form an environment having at least one defect density of a second value $\delta_2$. The second value $\delta_2$ is typically less than the first value $\delta_1$. Therefore, where the first value $\delta_1$ may be ⅜, ⅔ is preferably selected for the second value $\delta_2$ (according to the x/8 rule described above), such that this third defect card identifies regions having high flaw rates.

A fourth defect card may be created by unifying the third defect card with the first defect card. The regions having randomly distributed flawed individual dies (i.e., having low flaw densities) are added again such that not all of the individual dies of such regions are incorrectly classified as defective (i.e., inked).

By separating the data of regions having individual dies having low flaw densities and those regions having high flaw densities, and by handling the regions having high flaw densities separately, edges of contiguous regions having incorrectly identified individual dies may be taken into consideration.

In a preferred embodiment, after the creation of the fourth defect card, those individual dies which were classified as defective are re-classified as non-defective where their adjoining individual dies form an environment having non-defective individual dies. Therefore, a better delimitation of contiguous regions may be provided for individual dies identified as defective.

A fifth defect card may be produced such that those individual dies are also classified as defective whose adjoining individual dies have an environment having a defect density of a third value $\delta_3$. The third value $\delta_3$ is typically greater than first value $\delta_1$. In a preferred embodiment, the third value $\delta_3$ is ⅝ (according to the x/8 rule). Using this fifth defect card, statistically possible defective individual dies may be classified with higher reliability.

It is particularly advantageous to visually mark the defective individual dies and also the individual dies additionally classified as defective, preferably using a colored dot.

An apparatus is provided that includes a prober, where the coordinates of individual dies on the wafer are determined and stored in a memory device. Individual dies are electrically tested and defective dies are identified as defective in the two-dimensional field. First and the second defect cards are produced from the first two-dimensional field and stored in the memory device. A third defect card is produced from the second defect card and the third defect card is unified with the first defect card to create a fourth defect card. The fourth defect card provides coordinates of the individual dies identified as defective to a marking device for marking the corresponding individual dies on the wafer.

According to another aspect, a prober is provided for producing a defect card for dies in a wafer. The prober includes a controller, a memory and a visual marking device. The controller determines which of the semiconductor dies are defective, and produces a plurality of defect cards. The defective semiconductor dies whose adjoining semiconductor dies form an environment having a defect density up to a first value ($\delta_1$) are classified as defective on a first defect card. The defective dies which are not considered upon the production of the first defect card are classified as defective on a second defect card. A third defect card is produced by classifying additional individual dies on the second defect card as defective. Adjoining individual dies of the additional defective individual dies form an environment having at least one defect density of a second value ($\delta_2$), where the second value is less than the first value ($\delta_1$). A fourth defect card is produced by unifying the first and third defect cards. The memory stores coordinates of the dies on the wafer that are identified as defective in the fourth defect card. The visual marking device receives the coordinates of the dies identified as defective in the fourth defect card for marking the corresponding dies on the wafer.

These and other objects, features and advantages of the present invention will become more apparent in light of the following detailed description of preferred embodiments thereof, as illustrated in the accompanying drawings.

DETAILED DESCRIPTION OF THE INVENTION

Figure 1:
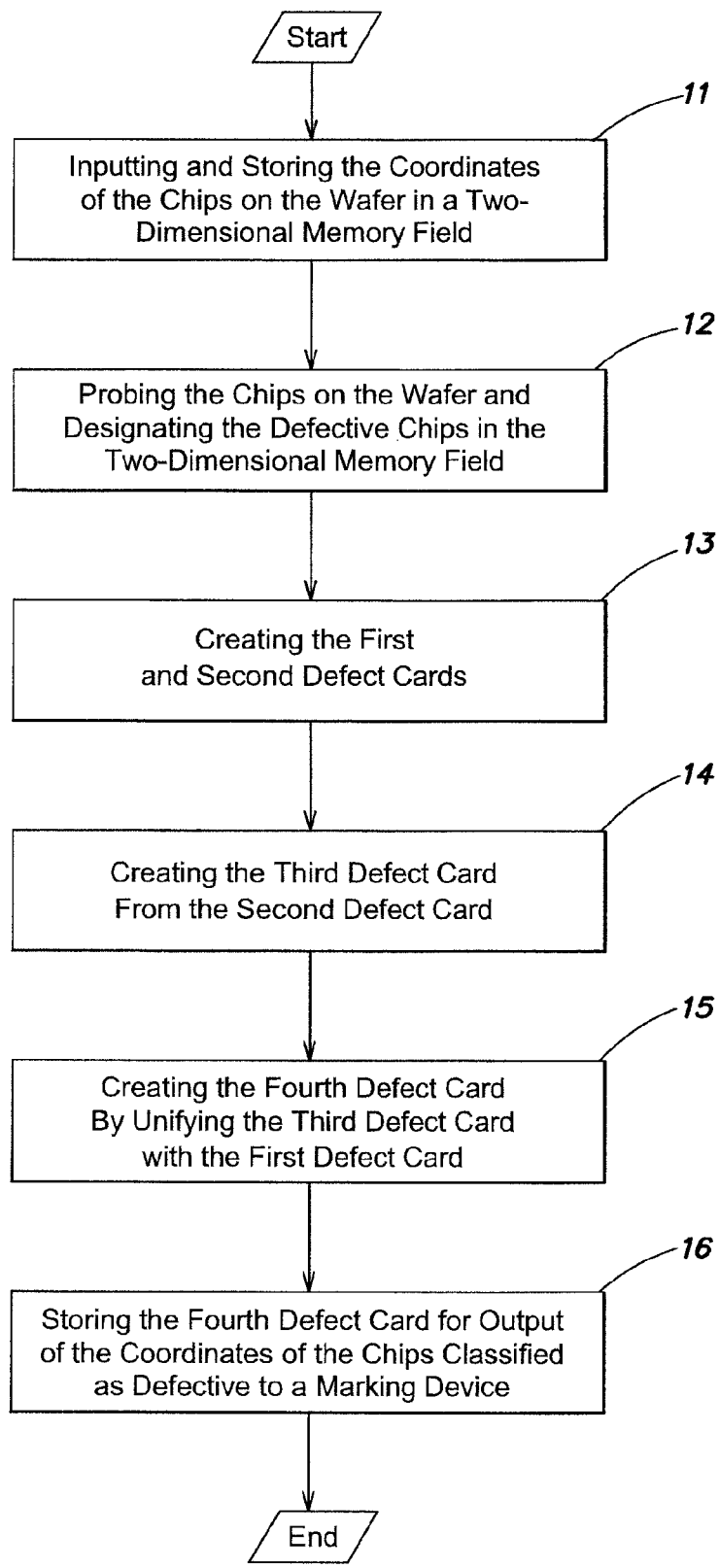
FIG. 1 illustrates a method for producing a defect card.
Figure 2:
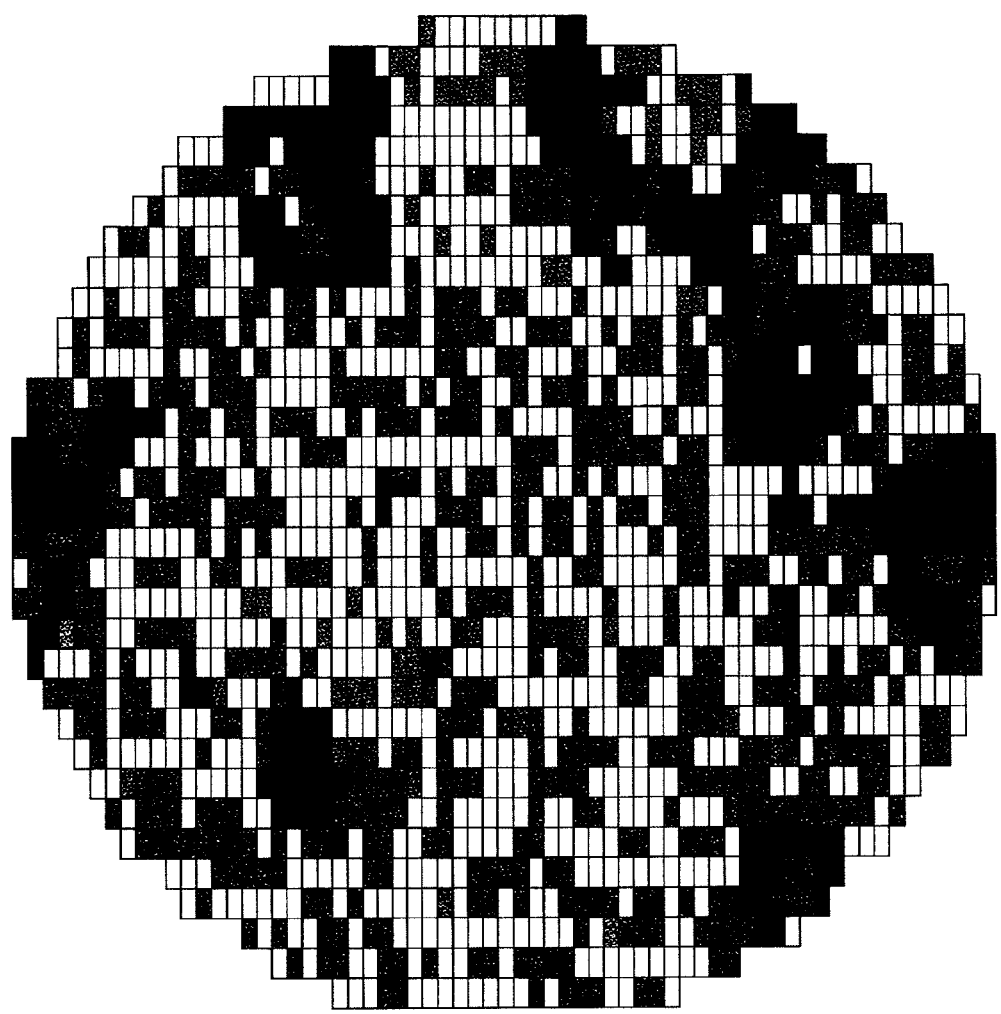
FIG. 2 illustrates a defect card of a probed semiconductor wafer according to the prior art.
Figure 3:
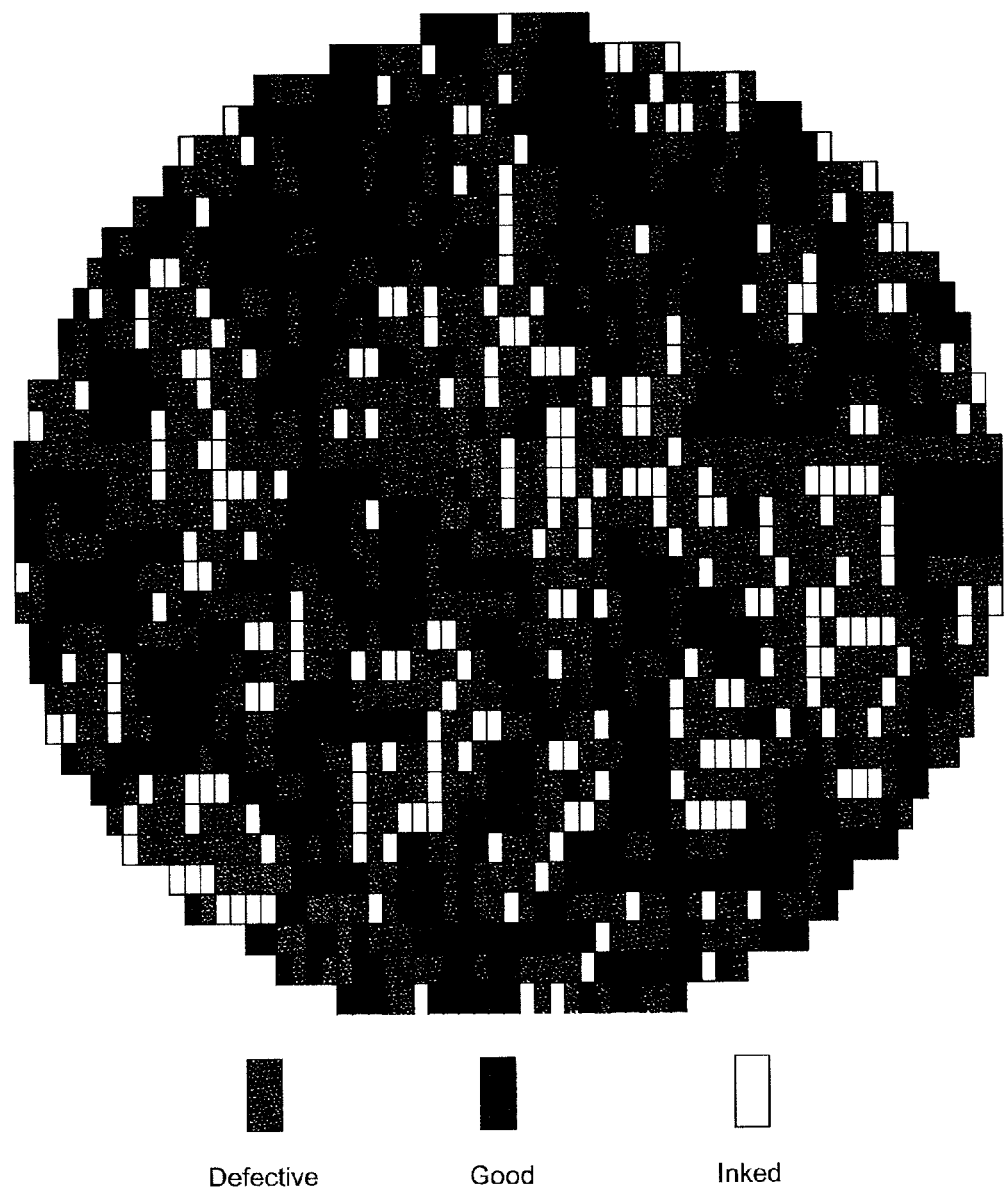
FIG. 3 illustrates a defect card created using the method illustrated in FIG. 1.
Figure 4:
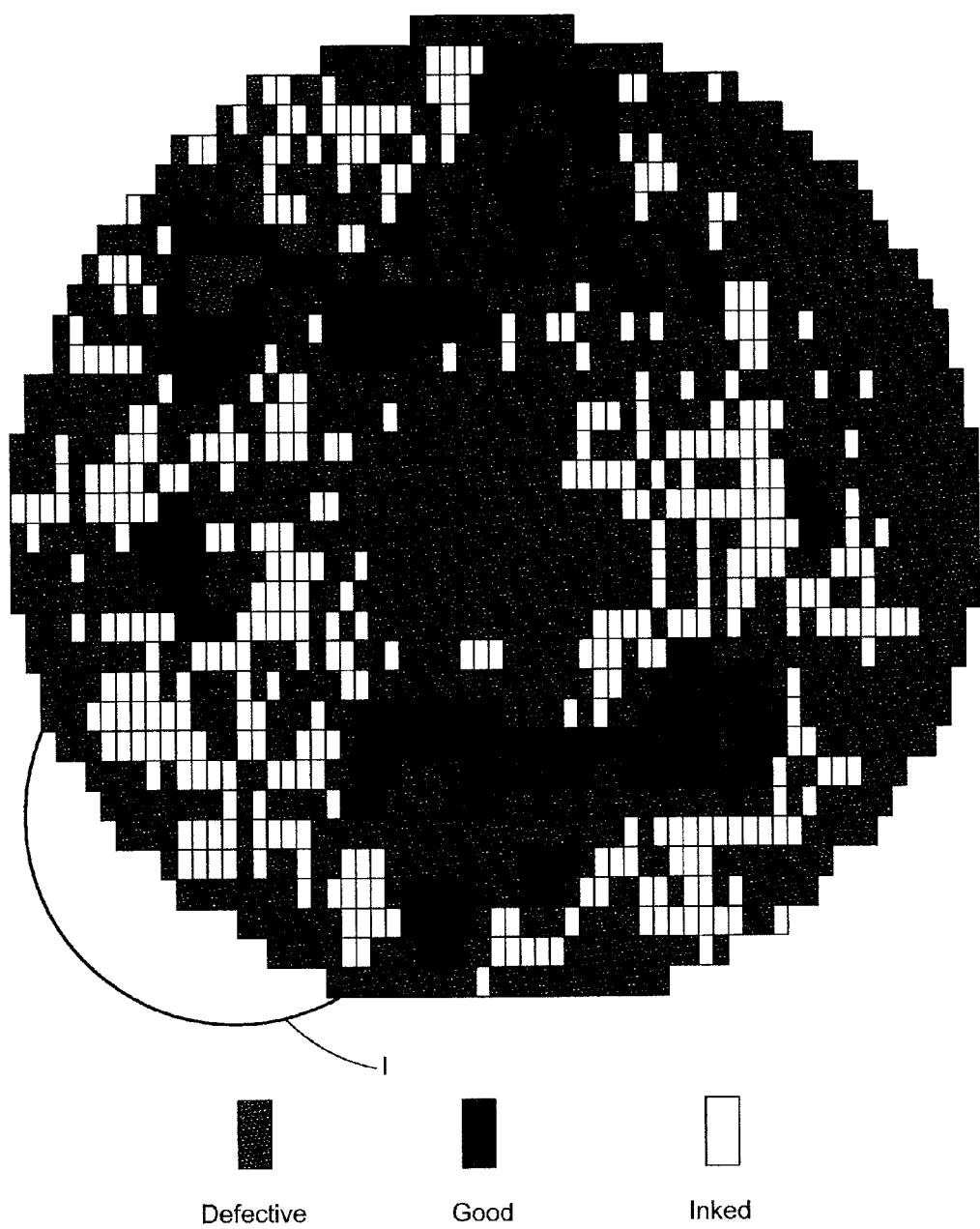
FIG. 4 illustrates a defect card of a another probed semiconductor wafer according to the prior art.
Figure 5:
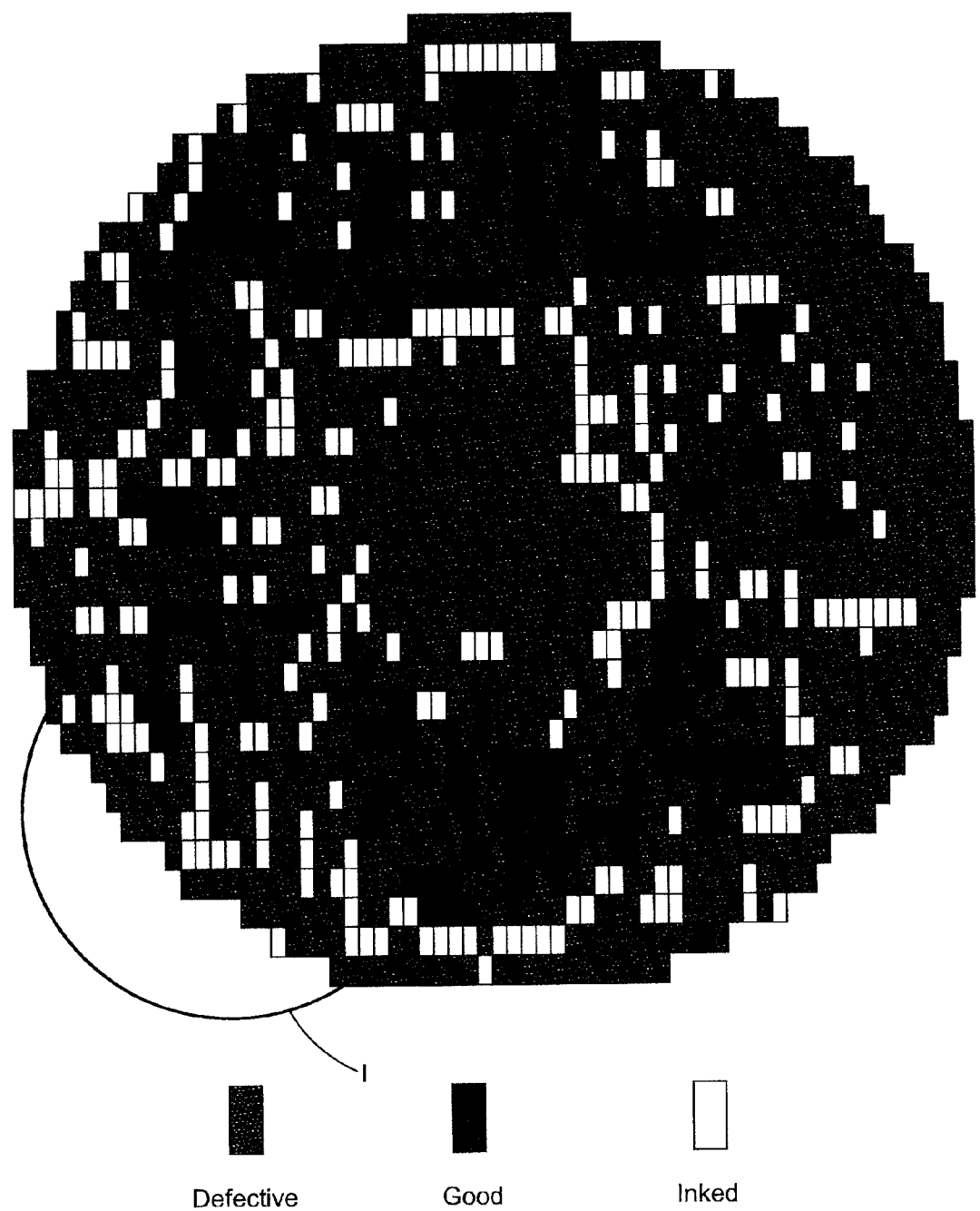
FIG. 5 illustrates another embodiment of a defect card created using the method shown in FIG. 1.

FIG. 1 illustrates one embodiment of a method for producing a defect card for dies manufactured on a semiconductor wafer. FIGS. 3 and 5 illustrate exemplary defect cards for wafers produced according to the method shown in FIG. 1. For the purpose of comparison, FIGS. 2 and 4 illustrate defect cards for the semiconductor wafers produced according to a prior art method, in particular the ⅝ rule as described above.

In FIGS. 2-5, dies identified as defective during probing are designated "Defective". Non-defective dies are designated "Good". Dies designated as defective using the known prior art method (e.g., the ⅝ rule) or the method set forth in FIG. 1 are designated as "inked".

Referring to FIG. 1, in step 11, coordinates of the chips processed on the semiconductor wafer are input and stored in wafer prober control unit memory device.

The dies on the semiconductor wafer are probed in step 12, and defective dies are identified in the memory device as defective.

In step 13, both first and second defect cards are produced. Specifically, during the probing, the identified defect dies are disjunctively associated with the first and second defect cards. For example, the defective dies whose adjoining eight dies form an environment having a defect density up to a first value $\delta_1$ (e.g., ⅜ according to the x/8 rule) are classified as defective on the first defect card. The defective dies which are not considered in the production of the first defect card and are also identified during the probing are classified as defective on the second defect card. In this example, the first value $\delta_1$ is selected such that dies having randomly distributed flaws (i.e., having lower flaw densities) are detected.

In step 14, a third defect card is produced from the second defect card. Specifically, additional dies are classified as defective on the second defect card whose adjoining dies form an environment having at least one defect density of a second value $\delta_2$ (e.g., ⅜ according to the x/8 rule) which is less than first value $\delta_1$. The second value $\delta_2$, therefore, is selected such that regions having high flaw rates are identified using the third defect card.

In step 15, a fourth defect card is produced by unifying the third defect card with the first defect card. The regions having randomly distributed flawed dies (i.e., having low flaw densities) are thus appended. As a result of which dies of such regions are not incorrectly classified as defective.

In step 16, the fourth defect card is stored for the purpose of outputting the coordinates of the dies classified as defective to a marking device of the wafer prober, such that the dies classified as defective, as shown in FIGS. 3 and 5, may be inked.

FIG. 3 illustrates an embodiment of the fourth defect card for a semiconductor wafer created using the method shown in FIG. 1. In comparison, FIG. 2 illustrates a defect card of the identical semiconductor wafer in FIG. 3 created using the known method of the ⅝ rule, i.e., having the same distribution of the defective dies identified during probing.

The defect card shown in FIG. 2 was created using the known method of the ⅝ rule such that the dies classified according to this rule are thus also inked. Notably, as illustrated in FIG. 2, nearly the entire region is inked. In contrast, regions in FIG. 3 having low and randomly distributed defect rates are not inked. Rather, regions having higher defect rates than the first value $\delta_1$ are recognized and further dies are classified as defective in these regions.

The fourth defect card in FIG. 5 shows that edges of contiguous regions of defective chips are recognized to a higher degree using the method in FIG. 1 in contrast to the defect card in FIG. 4 which uses the known ⅝ rule. Both of these defect cards are also based on the identical semiconductor wafer. The difference of the two defect cards may be clearly recognized in circled region I. According to FIG. 4, the boundaries of the regions having high defect rates, which are located, on the one hand, in the center of the wafer and, on the other hand, at the edge of the wafer, are not recognized and, therefore, are inked. The separation of these two regions, however, is clearly recognizable in region I of FIG. 5.

To improve the recognition of the edges of contiguous regions, after the production of the fourth defect card, those dies which were classified as defective may be reclassified as non-defective (i.e., de-inked) where their adjoining dies form an environment having non-defective dies.

In order to ensure, to a high degree of reliability, that substantially all statistically possibly defective chips are classified, a fifth defect card may be produced from the fourth defect card in another method step before performing step 16 (FIG. 1). In the fifth defect card, the dies whose adjoining dies have an environment having a defect density of a third value $\delta_3$ (e.g., 5/8), which is greater than the first value $\delta_1$ (e.g., 3/8), are also classified as defective.

The method may be used outside of semiconductor manufacturing. For example, the method is also relevant to other technical fields, such as biotechnology, where a plurality of individual die are manufactured simultaneously on glass or ceramic substrates.

Although the present invention has been illustrated and described with respect to several preferred embodiments thereof, various changes, omissions and additions to the form and detail thereof, may be made therein, without departing from the spirit and scope of the invention.

What is claimed is:

1. A method for producing a defect card for semiconductor dies located on a semiconductive wafer, in which defective individual semiconductive dies are identified using a measuring procedure, the method comprising:

producing first and second defect cards such that the defective individual dies are disjunctively associated with the first and the second defect cards, where the defective individual dies whose adjoining individual dies form an environment having a defect density up to a first value ($\delta_1$) are classified as defective on the first defect card, and where the defective individual dies which are not considered upon the production of the first defect card are classified as defective on the second defect card;

producing a third defect card by classifying additional individual dies on the second defect card as defective, where adjoining individual dies of the additional defective individual dies form an environment having at least one defect density of a second value ($\delta_2$), which second value is less than the first value ($\delta_1$); and producing a fourth defect card by unifying the third defect card with the first defect card.

2. The method of claim 1, where, upon the production of the fourth defect card, the individual dies which were additionally classified as defective are classified as non-defective when their adjoining individual dies form an environment having non-defective individual dies.

3. The method of claim 1, further comprising producing a fifth defect card, where individual dies whose adjoining individual dies have an environment having a defect density of a third value ($\delta_3$) are additionally classified as defective, and where the third value ($\delta_3$) is greater than the first value ($\delta_1$).

4. The method of claim 1, where, during the production of the first defect card, a 3/8 rule is used for the first value ($\delta_1$) of the defect density such that three of eight individual dies surrounding an individual dies, which is classified or identified as defective, are classified or identified as defective.

5. The method of claim 1, where, during the production of the third defect card, a 2/8 rule is used for the second value ($\delta_2$) of the defect density such that two of eight individual dies surrounding an individual dies, which is classified or identified is defective, are classified or identified as defective.

6. The method of claim 3, where, during the production of the fifth defect card, a 5/8 rule is used for the third value ($\delta_3$) of the defect density such that five of eight individual dies surrounding an individual die, which is classified or identified as defective, are classified or identified as defective.

7. The method of claim 1, where the defective individual dies and the individual dies additionally classified as defective are visually marked.

8. The method of claim 7, where the individual dies are marked using a colored dot.

9. The method of claim 1, where the semiconductor wafer includes an integrated circuit for at least one of the individual dies.

* * * * *